United States Patent [19]

Seaberg

[11] Patent Number: 5,461,381
[45] Date of Patent: Oct. 24, 1995

[54] SIGMA-DELTA ANALOG-TO-DIGITAL CONVERTER (ADC) WITH FEEDBACK COMPENSATION AND METHOD THEREFOR

[75] Inventor: C. Eric Seaberg, Austin, Tex.

[73] Assignee: Motorola, Inc., Schaumburg, Ill.

[21] Appl. No.: 165,683

[22] Filed: Dec. 13, 1993

[51] Int. Cl.$^6$ .................................................. H03M 1/12
[52] U.S. Cl. .......................................... 341/143; 341/155
[58] Field of Search ................................. 341/143, 155, 341/118; 375/28, 33

[56] References Cited

U.S. PATENT DOCUMENTS 4,772,871   9/1988   Suzuki et al. ........................ 341/155

OTHER PUBLICATIONS

Ritoniemi, et al.; "Fully Differential CMOS Sigma–Delta Modul for High Perform.Analog–To–Dig. Conv. with 5 V Oper. Voltage;" Reprint. from IEEE Proc. ISCAS'88; pp. 353–358, (1988).

Norsworthy, et al.; "A 14–bit 80–kHz Sigma–Delta A/D Converter: Model., Design, and Perform. Evaluation;" IEEE J. Solid–St. Cir.; pp. 342–352, (1989).

Primary Examiner—Brian K. Young
Attorney, Agent, or Firm—Paul J. Polansky

[57] ABSTRACT

A sigma-delta analog-to-digital converter (ADC) (80) includes first (81) and second (82) integrators, a quantizer (83) connected to an output of the second integrator (82), and a feedback circuit (84) connected to the output of the quantizer (83). In order to avoid the effects of delays through actual circuit elements, the feedback circuit (84) keeps the feedback signal to the first integrator (81) in a high-impedance state until the quantizer (83) resolves the output of the second integrator (82). Thus, the first integrator (81) avoids temporarily summing a possibly incorrect feedback signal. In addition, the feedback circuit (84) also keeps the first integrator (81) from integrating a sum of an input signal and the feedback signal until the feedback signal is driven to its correct state in response to the output of the quantizer (83). To accomplish these results, the feedback circuit (84) includes a compensation circuit (151) for continually determining when the quantizer (83) resolves.

16 Claims, 3 Drawing Sheets

SIGMA-DELTA ANALOG-TO-DIGITAL CONVERTER (ADC) WITH FEEDBACK COMPENSATION AND METHOD THEREFOR

FIELD OF THE INVENTION

This invention relates generally to analog-to-digital converters (ADCs), and more particularly, to sigma-delta ADCs.

BACKGROUND OF THE INVENTION

There are two basic techniques for implementing analog-to-digital converters (ADCs), the open-loop technique and the feedback technique. An open-loop converter generates a digital code directly upon application of an input voltage, and is generally asynchronous in operation. A feedback converter generates a sequence of digital codes from an input signal, reconverts these digital codes to an analog signal, and uses the reconverted analog signal as a feedback signal.

Sigma-delta ADCs use the feedback technique and have been known in the industry since the early 1960s. The sigma-delta technique is attractive because it achieves high resolution by precise timing instead of precisely matched on-chip components, such as resistors and capacitors used in open-loop converters. Thus, the sigma-delta technique is the technique of choice for many integrated circuit applications.

A basic sigma-delta ADC receives an analog input signal, and subtracts a feedback signal from the analog input signal to provide an error signal. The error signal is processed through a lowpass filter, and then quantized to form a digital output signal. A feedback digital-to-analog converter (DAC) provides the feedback signal after converting the digital output signal to analog form. Aside from the feedback DAC, the basic sigma-delta ADC may be implemented with conventional analog components such as operational amplifiers, comparators, and switched-capacitor filters. The basic sigma-delta ADC usually provides high resolution because integrated circuit clocking speeds allow the analog input signal to be highly over sampled. The basic sigma-delta ADC also has high signal-to-noise ratio (SNR) because the lowpass filter shapes quantization noise out-of-band, which can then be sufficiently attenuated by conventional filtering techniques.

One source of error degrading performance of sigma-delta ADCs is the degree of settling achieved in the switched-capacitor integrators. The degree of settling limits the clock rate of the converter. An upper bounded clock rate limits the maximum over-sampling ratio, or limits the maximum conversion bandwidth. If the necessary clock rate for a given over-sampling ratio and conversion bandwidth have been met, better inherent system settling may be traded off for such things as reduced gain-bandwidth of operational amplifiers, making the overall system smaller and more efficient. What is needed, then, is a sigma-delta ADC which exhibits better settling in the switched-capacitor circuitry resulting in a capability for higher over-sampling ratios, conversion bandwidths, or more efficient designs.

SUMMARY OF THE INVENTION

Accordingly, the present invention provides, in one form, a sigma-delta analog-to-digital converter (ADC) with feedback compensation, including first and second switched-capacitor integrators, a quantizer, and a feedback circuit. The first switched-capacitor integrator integrates a sum of an input signal and a first feedback signal during a first time period. The second switched-capacitor integrator is coupled to the first switched-capacitor integrator and integrates a sum of an output of the first switched-capacitor integrator and a second feedback signal during a second time period. The quantizer is coupled to the second switched-capacitor integrator, and provides an output signal of the ADC in at least first and second logic states in response to an output of the second switched-capacitor integrator. The quantizer provides the output signal a first delay time after the output of the second switched-capacitor integrator becomes valid. The feedback circuit provides the first feedback signal in a high impedance state during a first portion of the first time period, and provides the first feedback signal at first or second reference voltages respectively in response to the output signal of the ADC being in the first or second logic states, during a second portion of the first time period. The second portion of the first time period occurs a second delay time after a start of the first time period. The second delay time is equal to at least the first delay time.

In another form, the present invention provides a method for converting an analog input signal to a digital output signal. A first sum signal equal to a sum of the analog input signal and a first feedback signal is integrated to provide a first integrated signal during a first time period. The first integrated signal is integrated to provide a second integrated signal during a second time period. The second integrated signal is quantized to provide the digital output signal. The digital output signal is valid a first delay time after the second integrated signal becomes valid. The first feedback signal is provided in a high impedance state during a first portion of the first time period. The first feedback signal is provided at first or second reference voltages respectively in response to the digital output signal being in the first or second logic states, during a second portion of the first time period. The second portion of the first time period occurs a second delay time after a start of the first time period. The second delay time is equal to at least the first delay time.

These and other features and advantages will be more clearly understood from the following detailed description taken in conjunction with the accompanying drawings.

DETAILED DESCRIPTION OF A PREFERRED EMBODIMENT

Figure 1:
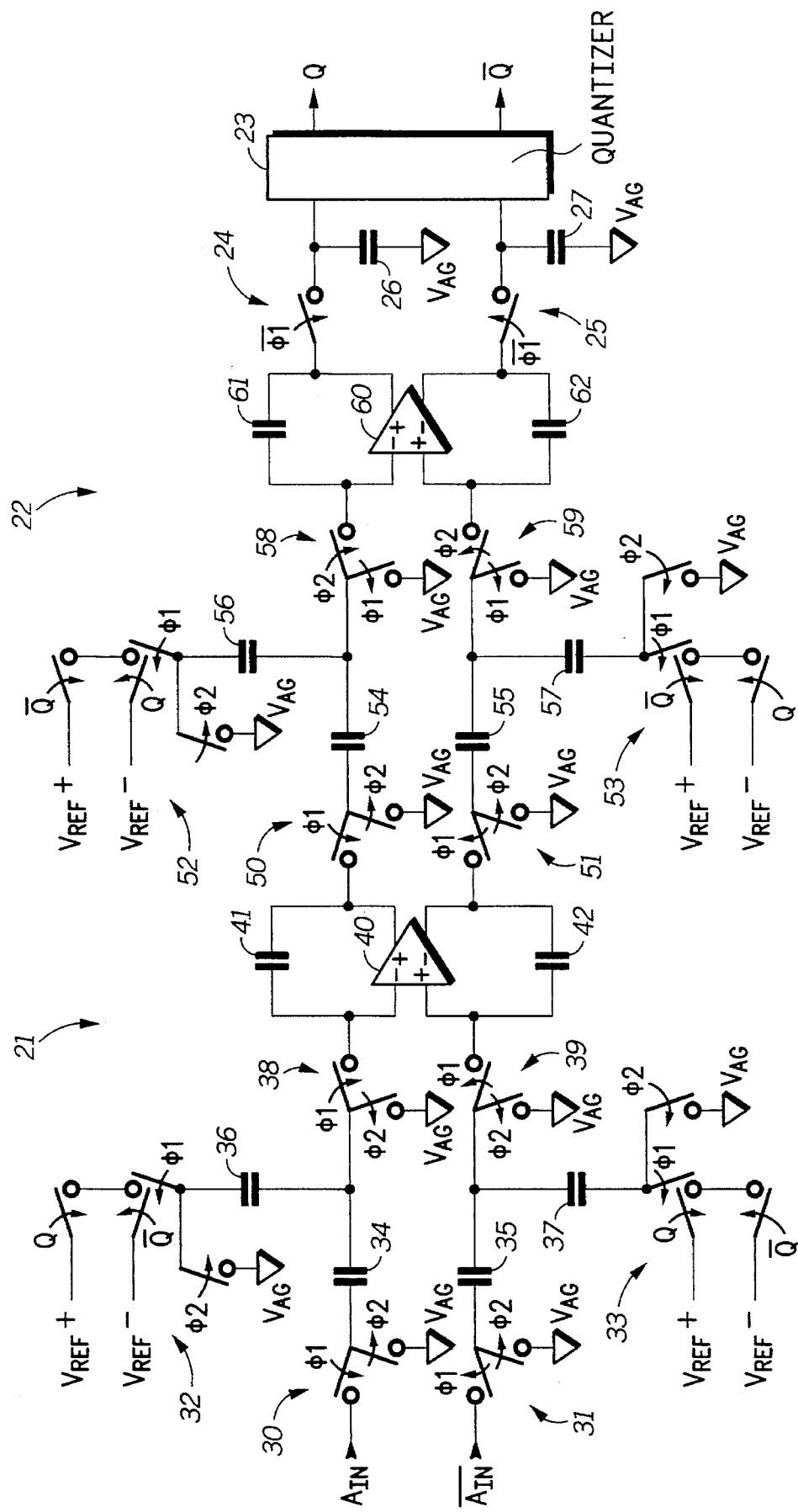
FIG. 1 illustrates in partial block diagram, partial logic diagram, and partial schematic form a sigma-delta analog-to-digital converter (ADC) according to the prior art.

FIG. 1 illustrates in partial block diagram, partial logic diagram, and partial schematic form a sigma-delta analog-to-digital converter (ADC) 20 according to the prior art. ADC 20 includes generally a first switched-capacitor integrator 21, a second switched-capacitor integrator 22, a quantizer 23, switches 24 and 25, and capacitors 26 and 27. Integrator 21 has negative and positive input terminals for receiving a differential signal having a positive component labeled "$A_{IN}$" and a negative component labeled "$\overline{A_{IN}}$", respectively, and positive and negative output terminals. Integrator 22 has negative and positive input terminals respectively connected to the positive and negative output terminals of integrator 21, and positive and negative output terminals. Quantizer 23 has a first input terminal connected through switch 24 to the positive output terminal of integrator 22, a second input terminal connected through a switch 25 to the negative output terminal of integrator 22, and positive and negative output terminals for providing signals labeled "Q" and "Q̄", respectively. Switches 24 and 25 both close when a signal labeled "Φ1" is active. Additionally, holding capacitors 26 and 27 are connected between the first and second input terminals of quantizer 23, respectively, and a power supply voltage terminal labeled "$V_{AG}$". $V_{AG}$ is an analog ground reference potential having a value about midway between positive and negative supply voltages.

Integrator 21 includes switches 30–33, capacitors 34–37, switches 38 and 39, a fully-differential operational amplifier 40, and capacitors 41 and 42. Capacitors 34–37 each have first and second terminals. The second terminals of capacitors 34 and 36 are connected together to form a first summing node. The second terminals of capacitors 35 and 37 are connected together to form a second summing node. Switch 30 is connected to the negative input terminal of integrator 21, and alternately connects the first terminal of capacitor 34 between signal $A_{IN}$ and $V_{AG}$ when signals labeled "Φ1" and "Φ2" are respectively active. Switch 31 is connected to the positive input terminal of integrator 21, and alternately connects the first terminal of capacitor 35 between signal $\overline{A_{IN}}$ and $V_{AG}$ when signals Φ1 and Φ2 are respectively active. Switch 32 connects the first terminal of capacitor 36 between one of two reference voltages labeled "$V_{REF}+$" and "$V_{REF}-$" as selected by signals Q and Q̄, respectively, when signal Φ1 is active, and connects the first terminal of capacitor 36 to $V_{AG}$ when signal Φ2 is active. Switch 33 connects the first terminal of capacitor 37 between one of reference voltages $V_{REF}+$ and $V_{REF}-$ as selected by signals Q and Q̄, respectively, when signal Φ1 is active, and connects the first terminal of capacitor 37 to $V_{AG}$ when signal Φ2 is active.

Amplifier 40 has negative and positive input terminals, a positive output terminal forming the positive output terminal of integrator 21, and a negative output terminal forming the negative output terminal of integrator 21. Switch 38 connects the first summing node alternatively to the negative input terminal of amplifier 40 or to $V_{AG}$ when signals Φ1 and Φ2 are respectively active. Switch 39 connects the second summing node alternatively to the positive input terminal of amplifier 40 or to $V_{AG}$ when signals Φ1 and Φ2 are respectively active. Capacitor 41 has a first terminal connected to the negative input terminal of amplifier 40, and a second terminal connected to the positive output terminal of amplifier 40. Capacitor 42 has a first terminal connected to the positive input terminal of amplifier 40, and a second terminal connected to the negative output terminal of amplifier 40.

Integrator 22 has an identical structure to, but is controlled differently than, integrator 21. Integrator 22 includes switches 50–53, capacitors 54–57, switches 58 and 59, a fully-differential operational amplifier 60, and capacitors 61 and 62. Capacitors 54–57 each have first and second terminals. The second terminals of capacitors 54 and 56 are connected together to form a first summing node. The second terminals of capacitors 55 and 57 are connected together to form a second summing node. Switch 50 is connected to the negative input terminal of integrator 22, and alternately connects the first terminal of capacitor 54 between the positive output terminal of integrator 21 and $V_{AG}$ when signals Φ1 and Φ2 are respectively active. Switch 51 is connected to the positive input terminal of integrator 22, and alternately connects the first terminal of capacitor 55 between the negative output terminal of integrator 21 and $V_{AG}$ when signals Φ1 and Φ2 are respectively active. Switch 52 connects the first terminal of capacitor 56 between one of reference voltages $V_{REF}+$ and $V_{REF}-$ as selected by signals Q and Q̄, respectively, when signal Φ1 is active, and connects the first terminal of capacitor 56 to $V_{AG}$ when signal Φ2 is active. Switch 53 connects the first terminal of capacitor 57 between one of reference voltages $V_{REF}+$ and $V_{REF}-$ as selected by signals Q and Q̄, respectively, when signal Φ1 is active, and connects the first terminal of capacitor 57 to $V_{AG}$ when signal Φ2 is active.

Amplifier 60 has positive and negative input terminals, a positive output terminal forming the positive output terminal of integrator 22, and a negative output terminal forming the negative output terminal of integrator 22. Switch 58 is connects the first summing node alternatively to the negative input terminal of amplifier 60 or to $V_{AG}$ in response to signals Φ2 and Φ1, respectively. Switch 59 is connects the second summing node alternatively to the positive input terminal of amplifier 60 or to $V_{AG}$ in response to signals Φ2 and Φ1, respectively. Capacitor 61 has a first terminal connected to the negative input terminal of amplifier 60, and a second terminal connected to the positive output terminal of amplifier 60. Capacitor 62 has a first terminal connected to the positive input terminal of amplifier 60, and a second terminal connected to the negative output terminal of amplifier 60.

ADC 20 is a second-order, single-bit ADC implemented with differential switched-capacitor integrators 21 and 22. The first integrator, integrator 21, integrates the sum of the input signal, $A_{IN}-\overline{A_{IN}}$, and the first stage feedback signal, either [($V_{REF}+$)−($V_{REF}-$)] or ($V_{REF}-$)−($V_{REF}+$)] as determined by quantizer 23. The first stage feedback signal is generated in switches 32 and 33. The second integrator, integrator 22, integrates the sum of the output of the first integrator, integrator 21, stored on capacitors 54 and 55, and the second stage feedback signal, either [($V_{REF}+$)−($V_{REF}-$)] or [($V_{REF}-$)−($V_{REF}+$)] as determined by quantizer 23. The second stage feedback signal is generated in switches 52 and 53 and is of opposite polarity relative to the first stage feedback signal. Quantizer 23 compares the differential output of integrator 22 to zero. The output signals of quantizer 23, signals Q and Q̄, are the result of the comparison. These signals determine the polarity of the feedback signal generated in reference switches 32, 33, 52, and 53. Timing is such that the first integrator, integrator 21, and quantizer 23 operate during the first phase, Φ1. The second integrator, integrator 22, operates during the second phase, Φ2.

Several inherent problems exist in this implementation. The feedback signal, either [($V_{REF}+$)−($V_{REF}-$)] or [($V_{REF}-$)−($V_{REF}+$)], changes some delay time after Φ1 goes high. The delay time is due to the finite time quantizer 23 takes to generate signals Q and Q̄ plus the time needed to configure the switches 32 and 33 to generate the correct analog feedback voltage. This inherent delay causes several problems, degrading the settling performance in integrators 21 and 22. Integrator 21 integrates the sum of the input signal and the first stage feedback signal. With the delay present in the feedback path, the previous time period's feedback signal will be summed and integrated until the delayed present period's feedback signal reaches the inputs of integrator 21. The previous time period's feedback signal may be of opposite polarity than the present feedback signal, causing integrator 21 to start to settle in the "wrong"

direction. Integrator 21 must then recover from the initial error and settle to the correct value. The time to recover may be relatively large depending on the magnitude of the feedback delay.

Figure 2:
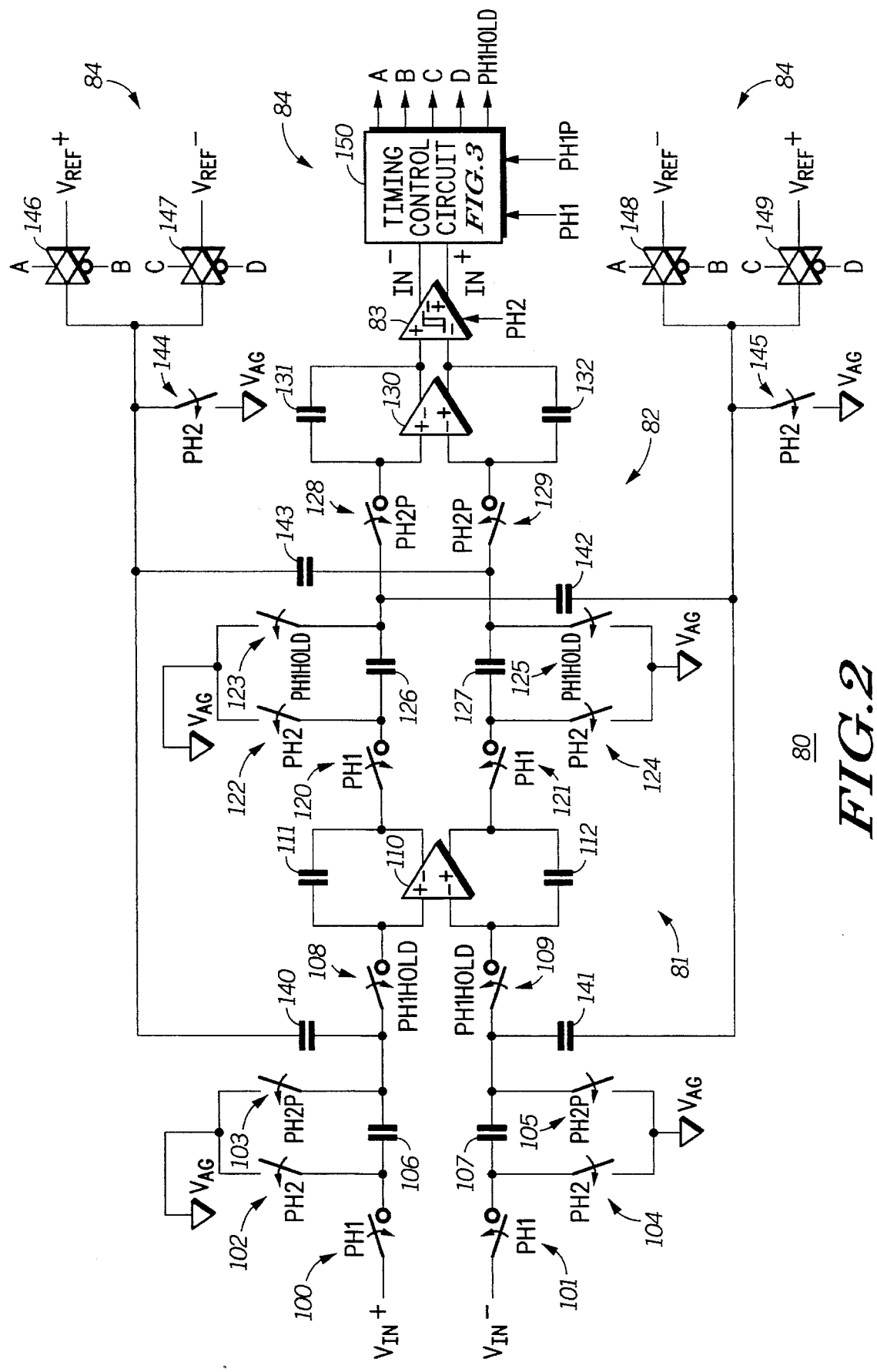
FIG. 2 illustrates in partial block diagram, partial logic diagram, and partial schematic form a sigma-delta ADC according to the present invention.

FIG. 2 illustrates in partial block diagram, partial logic diagram, and partial schematic form a sigma-delta ADC 80 according to the present invention. ADC 80 includes generally a first integrator 81, a second integrator 82, a quantizer 83, and a feedback circuit labeled generally 84. Integrator 81 has positive and negative input terminals for receiving a differential signal having a positive component labeled "$V_{IN}+$" and a negative component labeled "$V_{IN}-$", respectively, and positive and negative output terminals. Integrator 82 has positive and negative input terminals respectively connected to the negative and positive output terminals of integrator 81, and positive and negative output terminals. Quantizer 83 has positive and negative input terminals connected to the negative and positive output terminals of integrator 82, respectively, a control input terminal for receiving a signal labeled "PH2", and positive and negative output terminals for providing signals labeled "IN+" and "IN–", respectively. Feedback circuit 84 is connected to the positive and negative output terminals of quantizer 83, and provides feedback signals to integrators 81 and 82.

Integrator 81 includes switches 100–105, capacitors 106 and 107, switches 108 and 109, a fully-differential operational amplifier 110, and capacitors 111 and 112. Capacitors 106 and 107 each have first and second terminals. The second terminals of capacitors 106 and 107 form first and second summing nodes, respectively. Switch 100 is connected to the positive input terminal of integrator 81, and connects signal $V_{IN}+$ to the first terminal of capacitor 106 when signal PH1 is active. Switch 101 is connected to the negative input terminal of integrator 81, and connects signal $V_{IN}-$ to the first terminal of capacitor 107 when signal PH1 is active. Switch 102 has a first terminal connected to $V_{AG}$, and a second terminal connected to the first terminal of capacitor 106, and closes when signal PH2 is active. Switch 103 has a first terminal connected to $V_{AG}$, and a second terminal connected to the second terminal of capacitor 106, and closes when a signal labeled "PH2P" is active. Switch 104 has a first terminal connected to the first terminal of capacitor 107, and a second terminal connected to $V_{AG}$, and closes when signal PH2 is active. Switch 105 has a first terminal connected to the second terminal of capacitor 107, and a second terminal connected to $V_{AG}$, and closes when signal PH2P is active. Switch 108 has a first terminal connected to the second terminal of capacitor 106, and a second terminal, and closes when a signal labelled "PH1HOLD" is active. Switch 109 has a first terminal connected to the second terminal of capacitor 107, and a second terminal, and closes when signal PH1HOLD is active. Amplifier 110 has a positive input terminal connected to the second terminal of switch 108, a negative input terminal connected to the second terminal of switch 109, a positive output terminal forming the positive output terminal of integrator 81, and a negative output terminal forming the negative output terminal of integrator 81. Capacitor 111 has a first terminal connected to the positive input terminal of amplifier 110, and a second terminal connected to the negative output terminal of amplifier 110. Capacitor 112 has a first terminal connected to the negative input terminal of amplifier 110, and a second terminal connected to the positive output terminal of amplifier 110.

Integrator 82 has an identical structure to, but is controlled differently than, integrator 81. Integrator 82 includes switches 120–125, capacitors 126 and 127, switches 128 and 129, a fully-differential operational amplifier 130, and capacitors 131 and 132. Capacitors 126 and 127 each have first and second terminals. The second terminals of capacitors 126 and 127 form first and second summing nodes, respectively. Switch 120 has a first terminal connected to the positive input terminal of integrator 81, and a second terminal connected to the first terminal of capacitor 126, and closes when signal PH1 is active. Switch 121 has a first terminal connected to the negative input terminal of integrator 82, and a second terminal connected to the first terminal of capacitor 127, and closes when signal PH1 is active. Switch 122 has a first terminal connected to $V_{AG}$, and a second terminal connected to the first terminal of capacitor 126, and closes when signal PH2 is active. Switch 123 has a first terminal connected to $V_{AG}$, and a second terminal connected to the second terminal of capacitor 106, and closes when signal PH1HOLD is active. Switch 124 has a first terminal connected to the first terminal of capacitor 127, and a second terminal connected to $V_{AG}$, and closes when signal PH2 is active. Switch 125 has a first terminal connected to the second terminal of capacitor 127, and a second terminal connected to $V_{AG}$, and closes when signal PH1HOLD is active. Switch 128 has a first terminal connected to the second terminal of capacitor 126, and a second terminal, and closes when signal PH2P is active. Switch 129 has a first terminal connected to the second terminal of capacitor 127, and a second terminal, and closes when signal PH2P is active. Amplifier 130 has a positive input terminal connected to the second terminal of switch 128, a negative input terminal connected to the second terminal of switch 129, a positive output terminal forming the positive output terminal of integrator 82, and a negative output terminal forming the negative output terminal of integrator 82. Capacitor 131 has a first terminal connected to the positive input terminal of amplifier 130, and a second terminal connected to the negative output terminal of amplifier 130. Capacitor 132 has a first terminal connected to the negative input terminal of amplifier 130, and a second terminal connected to the positive output terminal of amplifier 130.

Feedback circuit 84 includes generally capacitors 140–143, switches 144 and 145, transmission gates 146–149, and a timing control circuit 150. Capacitor 140 has a first terminal, and a second terminal connected to the second terminal of capacitor 106. Capacitor 141 has a first terminal, and a second terminal connected to the second terminal of capacitor 107. Capacitor 142 has a first terminal connected to the first terminal of capacitor 141, and a second terminal connected to the second terminal of capacitor 126. Capacitor 143 has a first terminal connected to the first terminal of capacitor 140, and a second terminal connected to the second terminal of capacitor 127. Switch 144 has a first terminal connected to $V_{AG}$, and a second terminal connected to the first terminals of capacitors 140 and 143. Switch 145 has a first terminal connected to $V_{AG}$, and a second terminal connected to the first terminals of capacitors 141 and 142.

Transmission gate 146 has a first terminal for receiving reference voltage $V_{REF}+$, a second terminal connected to the first terminals of capacitors 140 and 143, a true control terminal for receiving a signal labeled "A", and a complement control terminal for receiving a signal labeled "B". Transmission gate 147 has a first terminal for receiving reference voltage $V_{REF}-$, a second terminal connected to the first terminals of capacitors 140 and 143, a true control terminal for receiving a signal labeled "C", and a complement control terminal for receiving a signal labeled "D". Transmission gate 148 has a first terminal for receiving reference voltage $V_{REF}-$, a second terminal connected to the first terminals of capacitors 141 and 142, a true control terminal for receiving signal A, and a complement control terminal for receiving signal B. Transmission gate 149 has a first terminal for receiving reference voltage $V_{REF}+$, a second terminal connected to the first terminals of capacitors 141 and 142, a true control terminal for receiving signal C, and a complement control terminal for receiving signal labeled D. Timing control circuit 150 has input terminals for receiving signals IN+ and IN−, and output terminals for providing signals A, B, C, D, and PH1HOLD.

ADC 80 is a second-order, single bit sigma-delta ADC implemented with differential switched-capacitor integrator stages 81 and 82. The input signals are summed with the first stage feedback signal and integrated during PH1. The second stage, integrator 82, integrates the sum of the first stage output with the second stage feedback signal during PH2. The second stage feedback signal is opposite in polarity with respect to the first stage feedback signal. Comparator 83, which performs the quantization, starts to evaluate at the end of PH2. The output of comparator 83 is provided to timing control circuit 150, which generates the appropriate control signals to generate the proper polarity of feedback, and generates special clock signals to control timing based on the total feedback delay.

Signals PH1 and PH2 are non-overlapping clocks with the same duty cycle, generated by circuitry not shown in FIG. 2. Signal PH1P rises with signal PH1, but falls a short time before signal PH1 falls. Signal PH2P likewise rises with signal PH2 and falls a short time before signal PH2 falls. In the illustrated embodiment, the sampling period typically ranges between 85 nanoseconds (ns) and 170 ns, and typical values for $V_{REF}+$, $V_{REF}-$, and $V_{AG}$ are 3.75 volts, 1.25 volts, and 2.5 volts respectively.

ADC 80 differs from ADC 20 of FIG. 1 in that timing control circuit 150 prevents integrator 21 from integrating incorrect values at the start of PH1. First, timing control circuit 150 sets signals A, B, C, and D so that transmission gates 146, 147, 148, and 149 are made nonconductive during PH2, destroying the feedback setup from the previous clock period. This timing prevents the wrong feedback signal from being present during the evaluation of the new feedback signal. Only after timing control circuit 150 next detects a valid output signal from comparator 83 after the start of PH1 does it set signals A, B, C, and D, and then does so in such a manner to prevent shorting reference voltages $V_{REF}+$ and $V_{REF}-$ together.

A second difference is that timing control circuit 150 prevents signal PH1HOLD from rising until both comparator 83 has resolved, and transmission gates 146–149 are configured correctly. This delay in the rise of PH1HOLD forces both the feedback term and the inputs to be present before the integration is allowed to proceed, thus removing false starts in the wrong direction. The settling of integrator 81 improves because integrator 81 does not have to recover from the false start in addition to the response dictated by the correct input signals.

The timing of timing control circuit 150 is dynamically adapted to the varying delay in comparator 83. The comparison delay varies due to variations in the input voltages to comparator 83, the manufacturing process, and temperature. This dynamic adaptation produces a robust design which utilizes the maximum percentage of the sampling phase after the feedback has been established.

Figure 3:
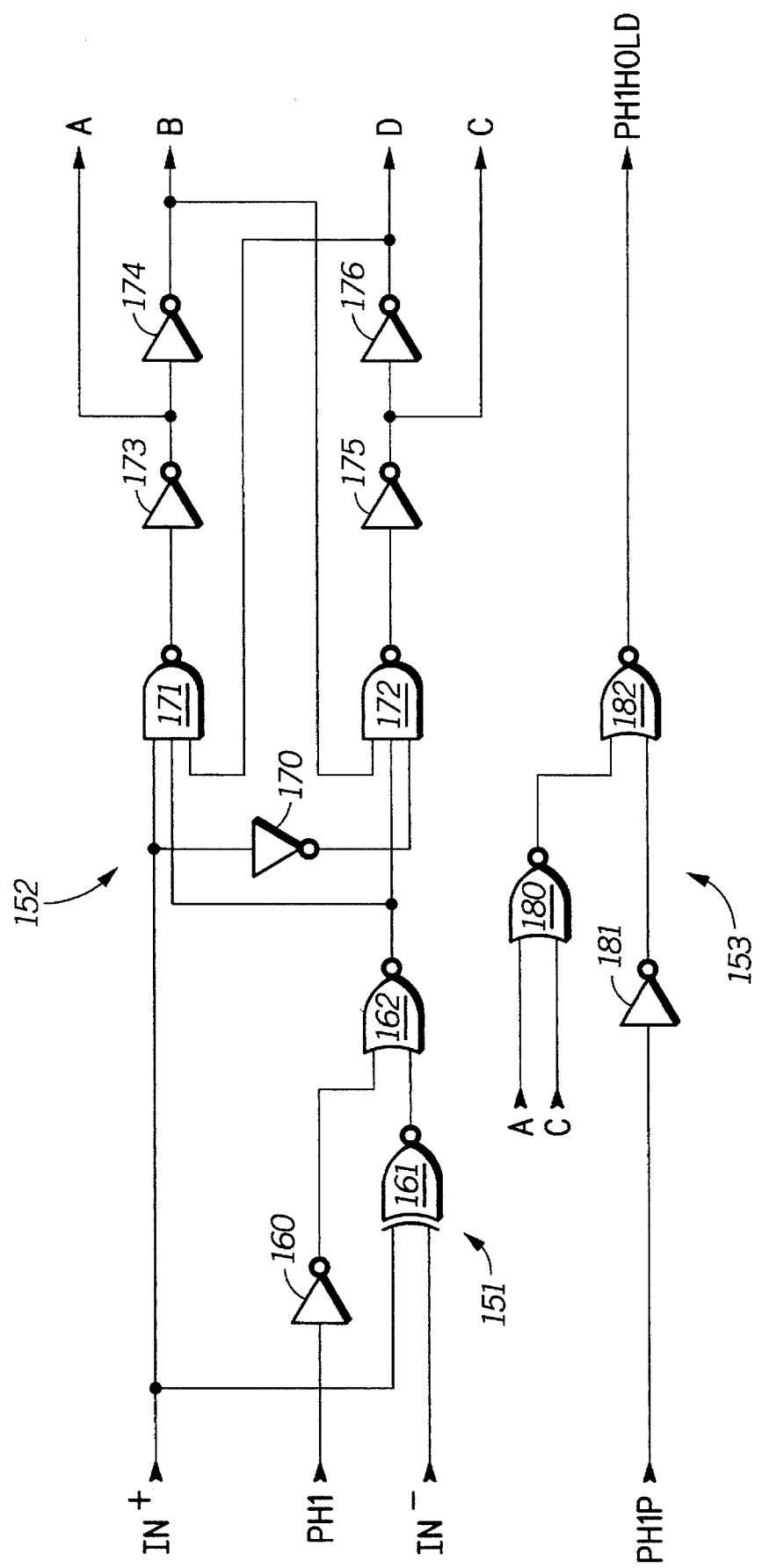
FIG. 3 illustrates in logic diagram form the timing control circuit of FIG. 2.

FIG. 3 illustrates in logic diagram form timing control circuit 150 of FIG. 2. Timing control circuit 150 includes generally a first compensation portion 151, a generating portion 152, and a second compensation portion 153. First compensation portion 151 includes an inverter 160, an exclusive-NOR gate 161, and a NOR gate 162. Inverter 160 has an input terminal for receiving signal PH1, and an output terminal. Exclusive-NOR gate 161 has a first input terminal for receiving signal IN+, a second input terminal for receiving signal IN−, and an output terminal. NOR gate 162 has a first input terminal connected to the output terminal of inverter 160, a second input terminal connected to the output terminal of exclusive NOR gate 161, and an output terminal.

Generating portion 152 includes generally an inverter 170, NAND gates 171 and 172, and inverters 173–176. Inverter 170 has an input terminal for receiving signal IN+, and an output terminal. NAND gate 171 has a first input terminal for receiving signal IN+, a second input terminal connected to the output terminal of NOR gate 162, a third input terminal, and an output terminal. NAND gate 172 has a first input terminal, a second input terminal connected to the output terminal of NOR gate 162, a third input terminal connected to the output terminal of inverter 170, and an output terminal. Inverter 173 has an input terminal connected to the output terminal of NAND gate 171, and an output terminal for providing signal A. Inverter 174 has an input terminal connected to the output terminal of inverter 173, and an output terminal for providing signal B. Inverter 175 has an input terminal connected to the output terminal of NAND gate 172, and an output terminal for providing signal C. Inverter 176 has an input terminal connected to the output terminal of inverter 175, and an output terminal for providing signal D.

Second compensation portion 153 includes generally a NOR gate 180, an inverter 181, and a NOR gate 182. NOR gate 180 has a first input terminal for receiving signal A, a second input terminal for receiving signal C, and an output terminal. Inverter 181 has an input terminal for receiving signal PH1P, and an output terminal. NOR gate 182 has a first input terminal connected to the output terminal of NOR gate 180, a second input terminal connected to the output terminal of inverter 181, and an output terminal for providing signal PH1HOLD.

Timing control circuit 150 first looks at the outputs of comparator 83, IN+ and IN−. Before the comparison, both IN+ and IN− are low. When the comparison is valid, one of the outputs of comparator 83 will rise to a logic high voltage. The output of exclusive NOR gate 161 therefore indicates a valid comparison, and allows timing control circuit 150 to detect the changing comparator delay. NOR gate 162 ensures this detection takes place during PH1. The output of NOR gate 162, in conjunction with signal IN+ provided at an output of comparator 83, are provided to generating portion 152 in order to provide non-overlapping clock signals A, B, C, and D. by guaranteeing that signals A, B, C, and D are non-overlapping with respect to each other, generating portion 152 prevents the shorting together of reference voltages $V_{REF}+$ and $V_{REF}-$. At this point in time, the feedback signal transmission gates 146–149 are configured. Second compensation portion 153 then drives signal PH1HOLD to a logic high when either signal A or signal C rises, in response to the rising edge of signal PH1P. Thus, second compensation portion 153 in effect delays the activation of signal PH1HOLD from the activation of signal PH1P, until feedback signals A, B, C, and D are present.

While the invention has been described in the context of a preferred embodiment, it will be apparent to those skilled in the art that the present invention may be modified in numerous ways and may assume many embodiments other than that specifically set out and described above. For example, ADCs of order higher than two, ADCs with multi-bit quantizers, ADCs with single-ended integrators, etc. may be implemented using the concepts taught herein. Also, ADC's with current-mode circuitry instead of switched-capacitors may be used. Accordingly, it is intended by the appended claims to cover all modifications of the invention which fall within the true spirit and scope of the invention.

I claim:

1. A sigma-delta analog-to-digital converter (ADC) with feedback compensation comprising:

a first switched-capacitor integrator for integrating a sum of an input signal and a first feedback signal during a first time period;

a second switched-capacitor integrator coupled to said first switched-capacitor integrator for integrating a sum of an output of said first switched-capacitor integrator and a second feedback signal during a second time period;

a quantizer coupled to said second switched-capacitor integrator, for providing an output signal of the ADC in at least first and second logic states in response to an output of said second switched-capacitor integrator, said quantizer providing said output signal a first delay time after said output of said second switched-capacitor integrator becomes valid; and a feedback circuit for providing said first feedback signal in a high impedance state during a first portion of said first time period, and for providing said first feedback signal at first or second reference voltages respectively in response to said output signal of the ADC being in said first or second logic states, during a second portion of said first time period, said second portion of said first time period occurring a second delay time after a start of said first time period, said second delay time equal to at least said first delay time.

2. The ADC of claim 1 wherein said feedback circuit includes compensation means for continually adjusting said second delay time in response to variations in said first delay time.

3. The ADC of claim 2 wherein said compensation means further controls said first switched-capacitor integrator to start an integration of said sum of said input signal and said first feedback signal a third delay time after said start of said first time period, said third delay time equal to at least said second delay time.

4. The ADC of claim 1 wherein said feedback circuit comprises:

a timing control circuit for providing a plurality of output timing signals to define said first and second portions of said first time period; and a feedback signal generator coupled to said timing control circuit, having an input terminal for receiving said plurality of output timing signals, and an output terminal for providing said first feedback signal to said first switched-capacitor integrator in response to said output signal of the ADC and said plurality of output timing signals.

5. The ADC of claim 4 wherein said feedback signal generator comprises:

a first switching element having a first terminal receiving a first reference voltage, a second terminal for providing said first feedback signal, and at least one control terminal responsive to at least a first one of said plurality of output timing signals;

a second switching element having a first terminal for receiving a second reference voltage, a second terminal coupled to said second terminal of said first switching element, and at least one control terminal responsive to at least a second one of said plurality of output timing signals; and a third switching element having a first terminal coupled to said second terminals of said first and second switching elements, and a second terminal coupled to a third reference voltage, said third switching element conductive during said second time period.

6. A sigma-delta analog-to-digital converter (ADC) with feedback compensation comprising:

a first switched-capacitor integrator for integrating a sum of an input signal and a first feedback signal in response to a timing control signal during a first time period;

a second switched-capacitor integrator coupled to said first switched-capacitor integrator for integrating a sum of an output of said first switched-capacitor integrator and a second feedback signal during a second time period;

a quantizer coupled to said second switched-capacitor integrator, for providing an output signal of the ADC in at least first and second logic states in response to an output of said second switched-capacitor integrator, said quantizer providing said output signal a first delay after said output of said second switched-capacitor integrator becomes valid; and a feedback circuit coupled to said quantizer for providing said first and second feedback signals in response to said output signal of the ADC, said feedback circuit further providing said timing control signal during said first time period after said output signal of the ADC is valid;

whereby said first switched-capacitor integrator only begins integration after said sum of said input signal and said first feedback signal is valid.

7. The ADC of claim 6 wherein said first switched-capacitor integrator comprises:

a first summing circuit having an input terminal for receiving a positive input signal, and an output terminal for providing a sum of said positive input signal and said first feedback signal during said first time period;

a second summing circuit having an input terminal for receiving a negative input signal, and an output terminal for providing a sum of said negative input signal and a complement of said first feedback signal during said first time period;

an operational amplifier having positive and negative input terminals, and positive and negative output terminals for providing first and second outputs of said first switched-capacitor integrator;

a first capacitor having a first terminal coupled to said positive input terminal of said operational amplifier, and a second terminal coupled to said negative output terminal of said operational amplifier;

a second capacitor having a first terminal coupled to said negative input terminal of said operational amplifier, and a second terminal coupled to said positive output terminal of said operational amplifier;

a first switch having a first terminal coupled to said output terminal of said first summing circuit, and a second terminal coupled to said positive input terminal of said operational amplifier, said first switch conductive in response to said timing control signal; and a second switch having a first terminal coupled to said output terminal of said second summing circuit, and a second terminal coupled to said negative input terminal of said operational amplifier, said second switch conductive in response to said timing control signal.

8. The ADC of claim 6 wherein said feedback circuit includes compensation means for continually adjusting said timing control signal in response to variations in a resolution time of said quantizer.

9. A sigma-delta analog-to-digital converter (ADC) with feedback compensation comprising:

a first switched-capacitor integrator having an input terminal for receiving an input signal during a first time period having first and second portions thereof, a feedback input terminal for receiving a first feedback signal during said second portion of said first time period, and an output terminal;

a second switched-capacitor integrator having an input terminal coupled to said output terminal of said first switched-capacitor integrator, a feedback input terminal for receiving a second feedback signal during a second portion of said first time period, and an output terminal;

a quantizer having an input terminal coupled to said output terminal of said second switched-capacitor integrator, and an output terminal for providing an output signal of the ADC in at least first and second logic states in response to an output of said second switched-capacitor integrator, said quantizer providing said output signal of the ADC a first delay time after said output of said second switched-capacitor integrator becomes valid; and a feedback circuit having an input terminal coupled to said output terminal of said quantizer, and an output terminal for providing said first and second feedback signals, said feedback circuit providing said first feedback signal in a high impedance state during said first portion of said first time period;

said feedback circuit providing said first feedback signal at first or second reference voltages respectively in response to said output signal being in said first or second logic states, during said second portion of said first time period;

said second portion of said first time period occurring a second delay time after a start of said first time period, said second delay time equal to at least said first delay time.

10. The ADC of claim 9 wherein said feedback circuit includes compensation means for continually adjusting said second delay time in response to variations in said first delay time.

11. The ADC of claim 10 wherein said compensation means further controls said first switched-capacitor integrator to start an integration of a sum of said input signal and said first feedback signal a third delay time after said start of said first time period, said third delay time equal to at least said second delay time.

12. The ADC of claim 9 wherein said feedback circuit comprises:

a timing control circuit for providing a plurality of output timing signals to define said first and second portions of said first time period; and a feedback signal generator coupled to said timing control circuit, having an input terminal for receiving said plurality of output timing signals, and an output terminal for providing said first feedback signal to said first switched-capacitor integrator in response to said output signal of the ADC and said plurality of output timing signals.

13. The ADC of claim 12 wherein said feedback signal generator comprises:

a first switching element having a first terminal receiving a first reference voltage, a second terminal for providing said first feedback signal, and at least one control terminal responsive to at least a first one of said plurality of output timing signals;

a second switching element having a first terminal for receiving a second reference voltage, a second terminal coupled to said second terminal of said first switching element, and at least one control terminal responsive to at least a second one of said plurality of output timing signals; and a third switching element having a first terminal coupled to said second terminals of said first and second switching elements, and a second terminal coupled to a third reference voltage, said third switching element conductive during a second time period.

14. A method for converting an analog input signal to a digital output signal comprising the steps of:

integrating a first sum signal equal to a sum of the analog input signal and a first feedback signal to provide a first integrated signal during a first time period;

integrating said first integrated signal to provide a second integrated signal during a second time period;

quantizing said second integrated signal to provide the digital output signal, the digital output signal valid a first delay time after said second integrated signal becomes valid;

providing said first feedback signal in a high impedance state during a first portion of said first time period; and providing said first feedback signal at first or second reference voltages respectively in response to said digital output signal being in said first and second logic states, during a second portion of said first time period, said second portion of said first time period occurring a second delay time after a start of said first time period, said second delay time equal to at least said first delay time.

15. The method of claim 14 further comprising the step of continually adjusting said second delay time in response to variations in said first delay time.

16. The method of claim 15 wherein said step of integrating said first sum signal comprises the step of integrating said first sum signal starting at a third delay time after said start of said first time period, said third delay time equal to at least said second delay time.

* * * * *